United States Patent
Lal et al.

(10) Patent No.: US 8,537,446 B2
(45) Date of Patent: Sep. 17, 2013

(54) MULTI-AXIS, LARGE TILT ANGLE, WAFER LEVEL MICROMIRROR ARRAY FOR LARGE SCALE BEAM STEERING APPLICATIONS

(75) Inventors: Amit Lal, Ithaca, NY (US); Serhan M. Ardanuc, Ankara (TR)

(73) Assignee: Cornell University, Ithaca, NY (US)

( * ) Notice: Subject to any disclaimer, the term of this patent is extended or adjusted under 35 U.S.C. 154(b) by 84 days.

(21) Appl. No.: 12/936,956

(22) PCT Filed: Apr. 8, 2009

(86) PCT No.: PCT/US2009/002181
§ 371 (c)(1),
(2), (4) Date: Dec. 27, 2010

(87) PCT Pub. No.: WO2009/126263
PCT Pub. Date: Oct. 15, 2009

(65) Prior Publication Data
US 2011/0101253 A1    May 5, 2011

Related U.S. Application Data

(60) Provisional application No. 61/043,379, filed on Apr. 8, 2008.

(51) Int. Cl.
*G02B 26/08*    (2006.01)

(52) U.S. Cl.
USPC ........................................ 359/198.1

(58) Field of Classification Search
USPC ............... 359/593, 596, 877, 198.1; 126/577
See application file for complete search history.

(56) References Cited

U.S. PATENT DOCUMENTS

| 4,771,764 A | 9/1988 | Cluff |
| 7,148,603 B1 | 12/2006 | Garcia et al. |
| 7,203,004 B2 * | 4/2007 | Zhang ........................... 359/877 |
| 2004/0008925 A1 | 1/2004 | Chen et al. |
| 2005/0007557 A1 | 1/2005 | Huibers |

* cited by examiner

*Primary Examiner* — Euncha Cherry
(74) *Attorney, Agent, or Firm* — William Greener; Bond, Schoeneck & King, PLLC

(57) ABSTRACT

A system (120) for reflecting or redirecting incident light, microwave or sound energy includes a first substrate (144) configured to support an array of reflective elements (130) that can be angularly displaced through a range of substantially (90) degrees in response to a reflector angle control signal and a controller programmed to generate the reflector angle control signal to achieve desired incident energy, beam or wavefront redirection. The reflective elements (130) preferably comprise MEMS micro-reflector elements hingedly or movably attached to the first substrate (130) and define a reflective surface that is aimed at the source of incident light, microwave or sound energy.

8 Claims, 19 Drawing Sheets

MULTI-AXIS, LARGE TILT ANGLE, WAFER LEVEL MICROMIRROR ARRAY FOR LARGE SCALE BEAM STEERING APPLICATIONS

CROSS REFERENCE TO RELATED APPLICATIONS

This application claims the benefit of priority under 35 U.S.C. 119(e) of U.S. Application No. 61/043,379 filed on Apr. 8, 2008, the entire disclosure of which is incorporated herein by reference.

BACKGROUND OF THE INVENTION

1. Field of the Invention

The present invention relates in general to zero-idle-power, large area surfaces to redirect incident light, microwave or sound waves. The surfaces include multi-axis, large tilt angle, micromirror arrays that can be displaced or rotated by control signals from a central or remote controller to achieve desired beam or wavefront redirection in a pixelated manner.

2. Description of the Background Art

The costs for obtaining and using conventional fuels are making solar energy collection more attractive. Solar energy does present challenges, however, because it cannot be collected in sufficient density or quantity in a cost effective and efficient way. There are also problems with making, installing and using solar trackers, solar collectors and solar concentrators which will adapt to changing environmental lighting conditions.

In general, solar concentrators increase the flux of solar energy through a given area. This in turn can be used to maximize the power output of photovoltaic cells, which are significantly and nonlinearly improved in performance when irradiated by intense sunlight. Specially designed solar cells, which are optimized for use in intense sunlight, are capable of producing more output power than a large area of solar cells at a lower concentration due to the increased quantum efficiency of the cells in this intense light environment. Concentrators also provide a means to direct solar energy into a small cross-sectional area, thereby making solar energy distribution practical for a variety of uses. Unfortunately, solar concentrators have an intrinsically narrow field of view—diminishing with increasing concentration. This necessitates the use of some kind of tracking device to follow the sun's motion. Electronically controllable and adaptable solid-state solar trackers based on predominantly flat optical boundaries which refract the sunlight and have a reconfigurable orientation provide a means to direct light into a desired direction for the purpose of collection, concentration, distribution, and conversion of the sunlight into other end-use energy products, but have proven to be (a) difficult to manufacture (b) complicated to install and (c) expensive.

Many solar energy harvesting technologies are not practical because they cannot be integrated directly into buildings and other structures without a substantial mechanical infrastructure as is typical with conventional solar technologies.

In view of the foregoing, a need remains for a method and system for reducing the cost and complexity of collecting or directing solar energy so that solar power collecting structures (e.g., modular tiles) can be made and sold to consumers or end users.

There is also, more generally, an opportunity to fulfill needs for centrally or remotely controlled arrays of reflectors for redirecting incident energy or radiation including visible light, acoustic energy or RF/or microwave energy which is incident upon a defined surface or over a defined area.

SUMMARY OF THE INVENTION

The present invention addresses the foregoing needs through provision of a method and system with zero-idle-power, large area surfaces to redirect incident light, microwave or sound waves. This is achieved by covering surfaces with multi-axis, large tilt angle, micromirror arrays that can be displaced/rotated by control signals from a central or remote controller to achieve desired beam or wavefront redirection in a pixelated manner. The key element in the pixel is an All-angle, Latchable Reflector (ALAR) which is a micromirror surface that can preserve its orientation/position without any power requirements, hence acting as a mechanical, non-volatile memory element. The structure of the present invention consumes energy only when it changes its orientation/position that corresponds to a state transition for this mechanical memory element.

Fabrication of the large arrays of micromirror surface uses the tools available in planar microfabrication or roll-to-roll manufacturing. Furthermore, integration of wireless electronics and photovoltaic power cells enable standalone, low weight, portable modular elements such as tiles that are easy to install with minimal constraint on the supporting environment. Important applications of the system of the present invention include wall to wall coated, concentrated solar power generation with solar tracking, and zero-idle-power, reconfigurable wallpapers.

In accordance with the present invention, the cost and complexity of collecting solar energy is reduced significantly so that solar power collecting tiles are available to end users or consumers in, for example, a neighborhood hardware store. The user buys modular tiles and places them in a regular array on a selected surface such as a roof or backyard area. The tiles are self-powered and automatically controlled to redirect or position incident solar light toward a central solar power collector. Each tile comprises an array of micro-mirrors that reflect the light toward a specific collection tower, or to a fixed position on the wafer. Tiles are pre-programmed or controlled to adjust themselves so that precise location of each tile is not a necessary step when the user installs the tiles. As the sun moves, or clouds come in certain sunlight view, the mirrors can adjust position to optimize light collection. In addition they can be controlled wirelessly to form desired focusing at a certain coordinate (e.g., using GPS signals), hence enabling focusing of energy incident on extremely large unflat and disjoint spaces on arbitrary points in the line of sight of mirrors. Large surface area to volume ratio, light weight, and ability to change its rotation and/or orientation allow each tile to be placed over a flat surface, by possibly simply dropping them from air. The system and method of the present invention provide a general architecture to harness light (e.g., from the sun, artificial lamps or lasers) and redirect the light using wafer-scale actuated micro mirrors towards a desired direction. The micro mirror array consists of mirrors that rotate about the center of axis and around the axis at their base with respect to the substrate. The mirrors need to move by substantial angles of greater than 30 degrees so that light collection is possible even when wafer is placed at a large angle with respect to the light source. This overall device will be called PLRS (Planar Light Redirecting System).

The system and method of the present invention also provide a light redirecting system packaged such that it can be casually placed on arbitrary surface (such as sand, dirt or grass) and can be powered by integrated power converters or be attached to an external power source. The light redirector can also include wired or wireless communication capability enabling mirror positioning from a central control command area. In addition, the PLRS is packaged and operates so it can sustain environmental conditions encountered indoors and outdoors (rain, heat, wind, dust).

The micromirrors are made using various micromachining techniques that enable fully reticulating or bending elements. The micromirror surfaces are actuated by combination of electrostatic, piezoelectric, and thermal actuators to place them in vertical position.

The present invention generally is possible due to advances in micromachined mirror arrays. Large, variable angle controllable reflector arrays with surfaces of controllable reflectance and focusing properties are well known for use with many optical applications. They are used over a large range of scale (e.g., meter or even kilometer scale), in solar power concentrators, satellite communication, light and laser shows in entertainment industry, etc. At the other extreme of microscale, reflector arrays are used in optical switches, beam scanners and a number of display technologies. While the large scale devices allow large angles of rotation and easy installation of off-the shelf two-axis tilt/rotate stages and motors, smaller size arrays provide increased bandwidth and increased precision. By merging concepts from these two scales, namely using microfabricated structures for large scale beam steering applications, the system and method of the present invention are developed.

The PLRS system of the present invention is suitable for applications that require large area, high fill-factor, optical surfaces that can change their angle of incidence with the incoming optical radiation. The method of the present invention, using micromirrors for large scale applications, is made more feasible recently because the semiconductor industry has seen an increase from 2-3 inch wafer sizes (circa 1965) up to 12 inch wafer sizes today; and 18 inch wafer sizes are nearly ready for commercial exploitation. There are many fabrication approaches to get rotating surfaces at microscale. One of the first examples of commercial micromirror arrays is fabricated using surface micromachining by Texas Instruments which used it in their projection display technologies (see, e.g., U.S. Pat. No. 5,535,047, Jul. 9, 1996 "Active yoke hidden hinge digital micromirror device", Hornbeck; Larry J. Texas Instruments Incorporated (Dallas, Tex.)). A significant variation from their method of manufacture was patented by Corning Inc. to create their micromirror array that can rotate with two degrees of freedom (see, e.g., U.S. Pat. No. 6,912,078, Jun. 28, 2005"Electrostatically actuated micro-electromechanical devices and method of manufacture:", Kudrle, et al. Corning Incorporated (Corning, N.Y.)). Both of these methods use electrostatic actuation for control of the mirrors.

In a prototype of the system and method of the present invention, semi-permanent angular positioning of hinged or compliant, polysilicon reflective plates or mirrors is accomplished by using off-chip generated ultrasonic and electrostatic forces. Intermediate reflector angles are realized by built-in stops for the moving plate. By novel lock-in structures and pulsed actuation, the mirrors can be trapped and freed from different rotation angles, such that zero static power is needed to maintain an angular position. Moreover, lack of on-chip actuators and electrical interconnects on the die enable very high-fill factors.

The lock-in structure of the present invention rotates mirror plates for actuation angles between 0° and 90° and has no on-chip actuators as the actuators are placed under and above the mirror arrays. This allows the high lateral fill-factor for the mirrors and zero-idle power as a result of temporary latching.

For an exemplary embodiment, a selected DC-voltage $V_{DC}$, applied between the chuck holding the die and the global top electrode works to pull the microstructures away from the surface of the die. An ITO coated glass-electrode is used to keep the mirror surfaces optically accessible, so that the motion of the structures can be recorded and analyzed later. A periodic voltage $V_{AC}$, applied across the piezoelectric ceramic (PZT) underneath the die generates stress waves that reach the contacting interfaces at the hinges, stuck parts or sliding surfaces. The stress waves modulate the tribological gap between the surfaces in contact. This modulation acts as an anti-stiction agent as well as a lubricant reducing the friction forces. The reduced friction and stiction enable the external forces such as electrostatic force to rotate the plate. A time varying signal with a selected frequency $V_{AC}$, is linearly swept at the instrument level to excite the time-varying structural resonances during the assembly process.

The prototype devices were fabricated using a 5-layer polysilicon surface-micromachining process, (e.g., the SANDIA-SUMMiT V™ process), with additional silicon nitride layers. However, the prototype devices were made exclusively of polysilicon layers, so a SUMMiT V™ process can also be utilized.

BRIEF DESCRIPTION OF THE DRAWINGS

The features and advantages of the present invention will become apparent from the following detailed description of a number of preferred embodiments thereof, taken in conjunction with the accompanying drawings, in which.

DETAILED DESCRIPTION OF THE PREFERRED EMBODIMENTS

Figure 1:
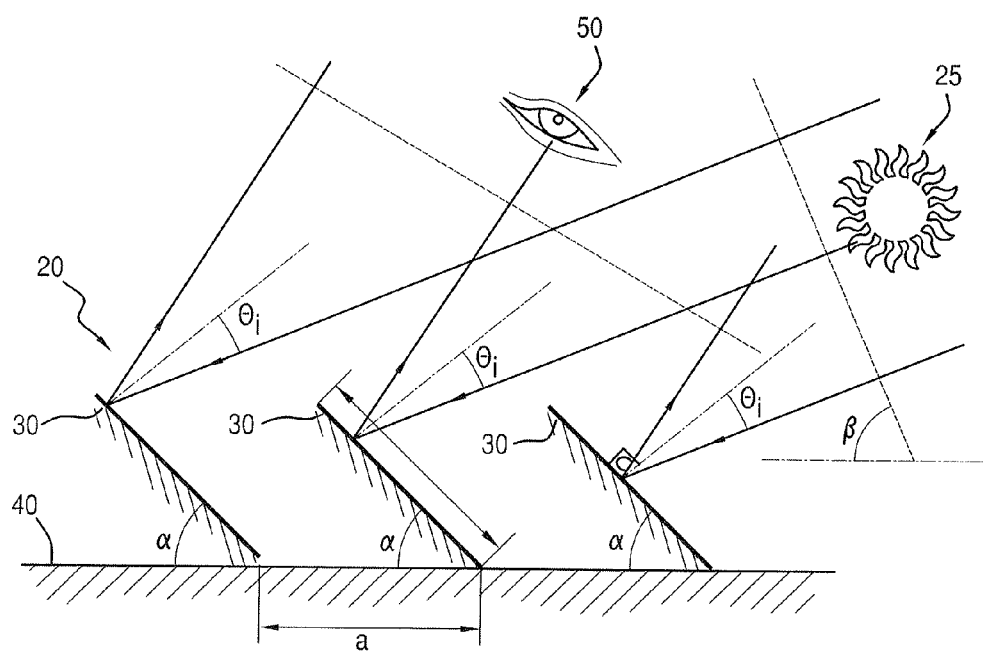
FIG. 1 is a schematic diagram illustrating an embodiment of the system for redirecting light in accordance with the present invention. Broadly speaking, the tile structure shown in FIG. 1 can be used for reflection and redirection of waves of different phenomena and wavelengths, in accordance with the present invention.

FIG. 1 illustrates an embodiment of the system 20 for redirecting light in accordance with the present invention. Broadly speaking, the tile structure shown in FIG. 1 can be used for reflection and redirection of waves of different phenomena and wavelengths. Electromagnetic and acoustic waves are the most tangible energy types when considering daily communication needs. Solar light (e.g., from light source 25) including submicron wavelengths and RF waves used for wireless communication with wavelengths on the order of centimeters are examples of electromagnetic waves. Acoustic or pressure or sound waves, span similarly wide range of wavelengths in general. Strictly speaking, the actual physical response of a planar reflector is determined by the wave impedance of the reflector and the boundary conditions of the system. One can, however, make some generalizations regarding the nature of the wave and ray optics.

Interference effects for phase critical applications: exemplary frequencies of propagation for a given wavelength for both electromagnetic (EM) waves and acoustic waves are listed in Table 1

TABLE 1

Working the formula c = λ f, where c is phase velocity, λ is wavelength, and f is the frequency.

| | f | |
|---|---|---|
| λ | Acoustic Waves (c = 340 m/sec) | EM Waves (c = 3 × 10$^8$ m/sec) |
| 100 µm | 3.4 MHz | 3 THz |
| 1 mm | 340 kHz | 300 GHz |
| 1 cm | 34 kHz | 30 GHz |
| 1 dm | 3.4 kHz | 3 GHz |
| 1 m | 340 Hz | 300 MHz |

If we assume the arrangement shown in FIG. 1, the interference between the reflected wave is constructive when the Bragg condition is satisfied. In other words, plane waves reflect as plane waves without distortion in the wave-front.

$$2a\sin(\theta_i+\alpha)=2a\sin(\beta)=n\lambda \quad (1)$$

Here n is an integer, $\theta_i$ is the angle of incidence on each planar reflector 30, α is the angular position of the reflector 30 as measured from the substrate or tile surface 40, and a is the spacing with the tiles. The last one is assumed to be equal to the reflector side length assuming close to unity fill-factor. The left-hand side of equation (1) takes values between zero and 2a. Hence for phase critical applications, where the observer (e.g., 50) spans far more than a, the interference effects can limit the wave frequency unless β is limited to small values.

For example: if we have a reflector size of a=1 cm and incident wavefront angle of β=30°, then from (1) and Table (1), the wavefront is reflected without any distortion at subharmonics of 34 kHz and 30 GHz for acoustic and EM waves, respectively.

FIG. 1 illustrates incident and reflected wavefronts from a region of planar reflectors 30 that would be part of an exemplary tile structure or system 20. The figure depicts a special case when all the reflectors are parallel to each other at an actuation angle of α. Equation 1 gives the condition for constructive interference, which ensures that plane waves reflect as plane waves (e.g., to target or observer 50).

For solar-power applications where phase is not critical, what matters is the number of reflectors 30 targeting a certain thermal or photovoltaic power generation tower. In this case, many individual reflectors can be treated as a wave source with random phase. The magnitude of their averaged sum, which is the transmitted power, is proportional to the number of reflectors 30.

Boundary conditions and reflector impedance also matter. How one makes high-reflectivity solar reflectors is very well known. Metalized, extremely smooth surfaces can ordinarily give reflectance in excess of 90%. This point deserves some attention in case of incident energy in the form of acoustic waves. The reflector should be acoustically UNmatched to the transmission medium. As the medium of propagation is air, the structure needs to be well supported so that the mechanical resonance frequencies of the reflectors are well above the wave propagation frequency, f. Otherwise, the incoming acoustic wave can excite vibrations on the reflector tile, which would cause reduction in the reflected acoustic power and efficiency.

Surface roughness also matters. As a rule of thumb, a surface is regarded to be smooth as long as the RMS roughness of the same is an order of magnitude smaller than the wavelength of the wave. For a given tile geometry, this requirement is of course more stringent in case of solar applications than it is in sonic applications. The current state of the art for the surface quality of large-area reflectors used for solar applications is sufficient for the present invention. Packaging can include a protective glass cover over the tiles 40 for many EM applications provided that the choice of materials is done with optical absorption properties in mind. However, a closed and rigid cover is not an option in the case of acoustic applications, where any rigid object in the pathway of incoming wave and the reflector acts as an obstacle.

Turning now to FIGS. 2-5, the system and method of the present invention can be configured in a variety of ways to provide 2D plane rotation. MEMS fabrication engineers and others will appreciate that many implementations ranging from sub-micro scale to meter scale are practicable. Referring to the embodiment of FIG. 2, a system 120 configured for reflecting or redirecting incident light (or microwave or sound energy), comprises a first platform substrate 144 configured to hingedly support a large tilt angle micromirror array comprising a plurality of reflective elements 130 that can be angularly displaced in response to a reflector angle control signal. A second base substrate 140 or modular tile is configured to rotate-ably support first substrate 144 for rotation in response to a platform azimuth control signal.

Figure 2:
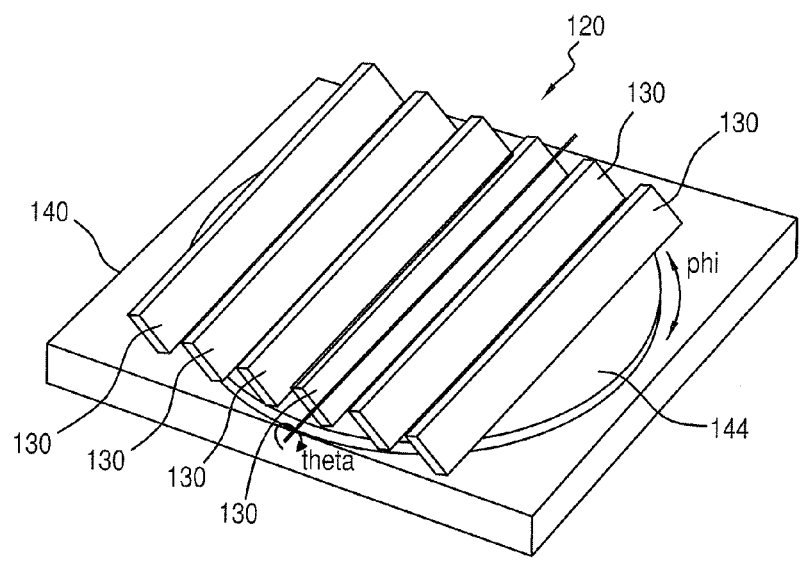
FIG. 2 is a perspective view schematically illustrating a parallel mirror array carried on a rotating platform, in accordance with the present invention.

In the embodiment of FIG. 2 (a schematic diagram of one implementation where parallel arrays of mirrors that can rotate around theta-axis are situated over a platform that can rotate along the degree of freedom labeled as phi-axis) circular platform or plate 144 is actuated for rotation at any azimuth theta, with optional incident energy sensors to determine the precise optimum angular position.

The set of rectangular plates 130 are hingedly configured to rotate with respect to their long axis. There might be one actuator to actuate all of the plates 130 at the same time, or each plate 130 or set of plates can have actuators to obtain individual or subset control. Since the plates 130 can aim at any reflector angle theta and the rotating platform or stage 144 can aim at any azimuth phi, overall, one can orient the set of plates to face any direction within a hemisphere. This capability enables the collection of any waves, whether they are electromagnetic or acoustic. For directing solar light, the plates 130 can be simple mirrors. For acoustics the reflective elements 130 can be simple plastic plates with high acoustic impedance compared to air. For RF reflection, the surfaces can be a metal coated plastic. Another modality of the device would be to convert the moving plates 130 into plates with integrated lenses (e.g., 230, as in FIG. 3) that concentrate the light and shine over photovoltaic cells under the cells to realize direct conversion with each tile, greatly reducing the over PV cell volume needed.

The plates 130 can be mounted by a hinge, or by a flex spring, and rotating platform 144 can be attached to the bottom plate 140 by friction, or by various threaded retainers. The surface of the bottom plate 140 or the bottom of the rotating plate 144 can have increased friction surfaces such as with felt material. The friction forces will serve to keep the rotating azimuth held in place, enabling the elimination for constant motor actuation to maintain position.

The entire rotating platform 144 can be rotated by bottom plate magnetic or electrostatic actuators. Actuators for the plates 130 can be Electromechanical motors connected to all the mirrors 130, Ultrasonic shakers to reduce friction at hinge followed by magnetic or electrical forces, or Ultrasonic actuators connected to mechanical linkages connected to mirror plates or plates connected to mirrors. Actuators for the rotating platform 144 can be an Electromechanical motor connected by a wheel mounted on the rotating platform, an Ultrasonic motor that creates tiny motions by pushing the plate or each light tile 130 can include a wireless or wired interface to a neighboring tile to coordinate location and actuation, and possibly to deliver power. Each tile optionally includes a photovoltaic cell or other power harvesting device to store enough energy into a storage battery so that the light tile can operate without any external power. Each tile 130 optionally includes optical detectors (e.g., cameras or photodiodes) to provide a sensor signal used by a pre-programmed controller to align the tile surface to a source of incident energy or beacon. Each tile can also include microphonic receivers and transmitters to align the tile 130 to a plane of reference.

Preferably, a central or remote controller is programmed to generate the reflector angle ($\theta$) control signal and the platform azimuth angle ($\phi$) control signal to achieve desired incident energy beam or wavefront redirection. Each tile can include its own controller or microprocessor programmed with three dimensional information about the incident energy source and the target to which redirected energy is to be aimed. Each tile also preferably has separately addressable or unique identification for tile-specific remote control.

Figure 3:
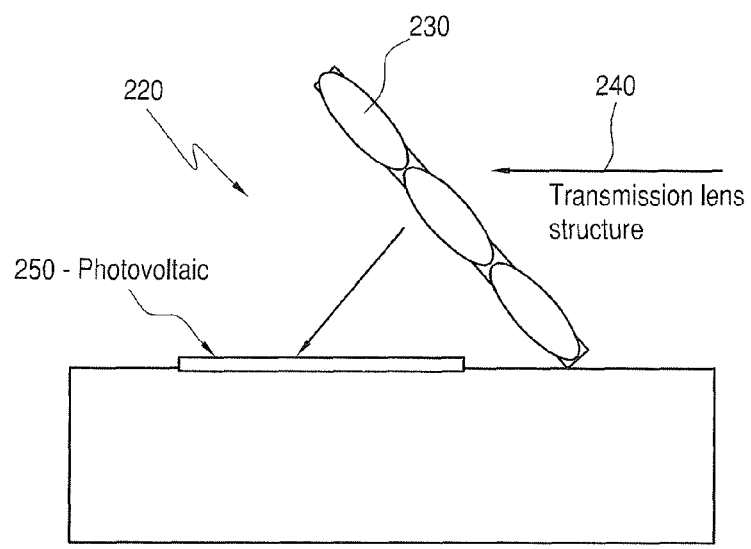
FIG. 3 is a diagram illustrating a transmission lens embodiment, in accordance with the present invention.

System 220 illustrated in FIG. 3, includes field concentrating electromagnetic or acoustic lenses 230 which define refractive lens structures to provide a spatial gradient or distribution of different effective indices of refraction, such that incident energy or radiation 240 is phase shifted and redirected to a target (e.g., photovoltaic 250). In contrast, in reflective redirectors, the incident light is reflected with angles.

Figure 4A:
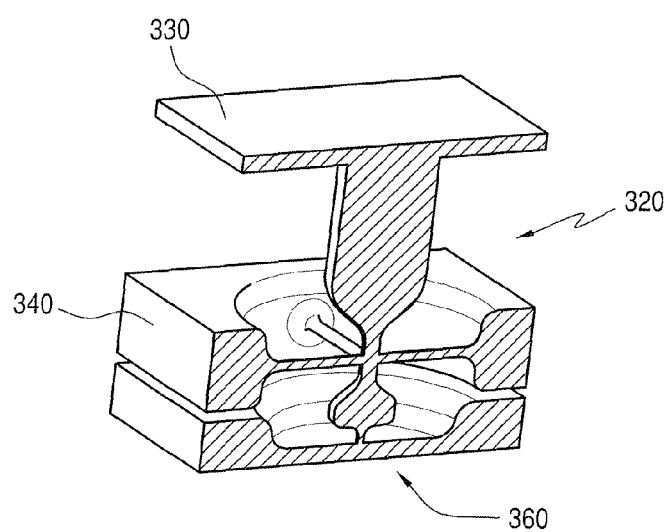
FIGS. 4a and 4b are perspective views of a pivoting reflector system, in accordance with the present invention.
Figure 4B:
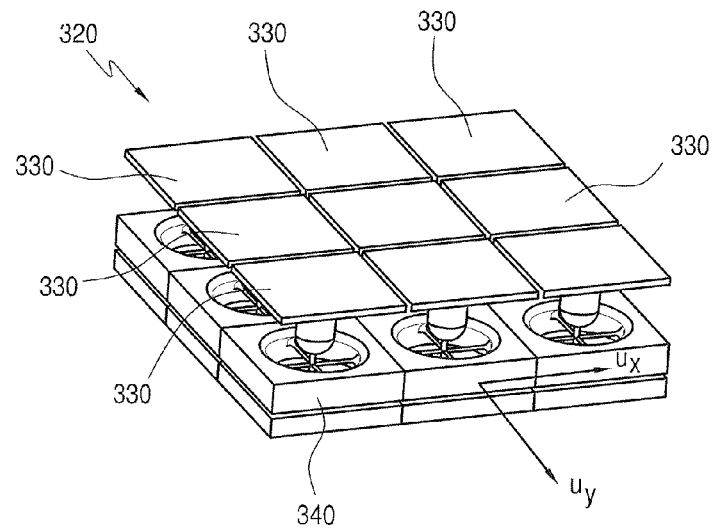
Figure 5:
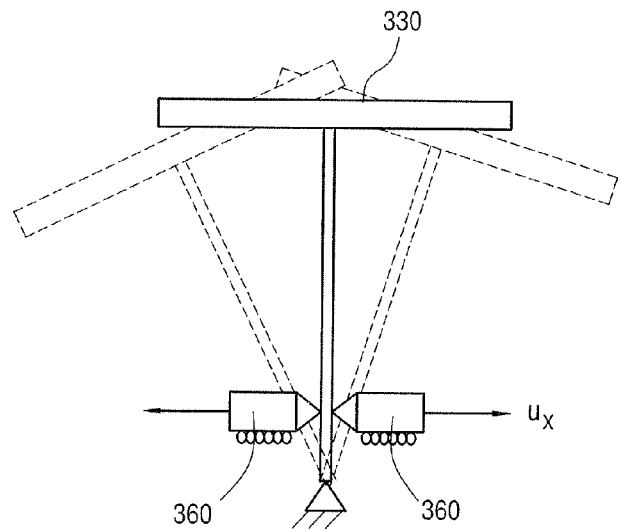
FIG. 5 is a schematic diagram illustrating operation of the pivoting reflector systems of FIGS. 4a and 4b, in accordance with the present invention.

Another implementation example is illustrated in FIGS. 4a, 4b and 5 wherein system 320 utilizes rotational actuators and hinged structures. System 320 is configurable for pivoting strut supported planar reflectors 330 for reflecting or redirecting incident light, microwave or sound energy. A mechanical arrangement has planar reflectors 330 on support struts which are pivotable by actuators 360 to achieve redirection of light, acoustics, and RF fields in any direction from a surface.

Figure 6A:
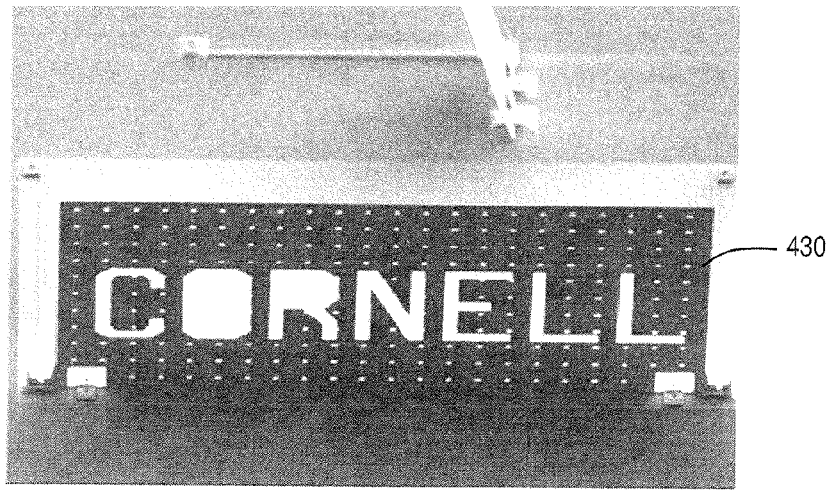
FIG. 6a is a SEM picture of an assembled polysilicon flap (562 μm×280 μm) which is erected from rest position to vertical state using a combination of electrostatic and ultrasonic forces, in accordance with the present invention.
Figure 6B:
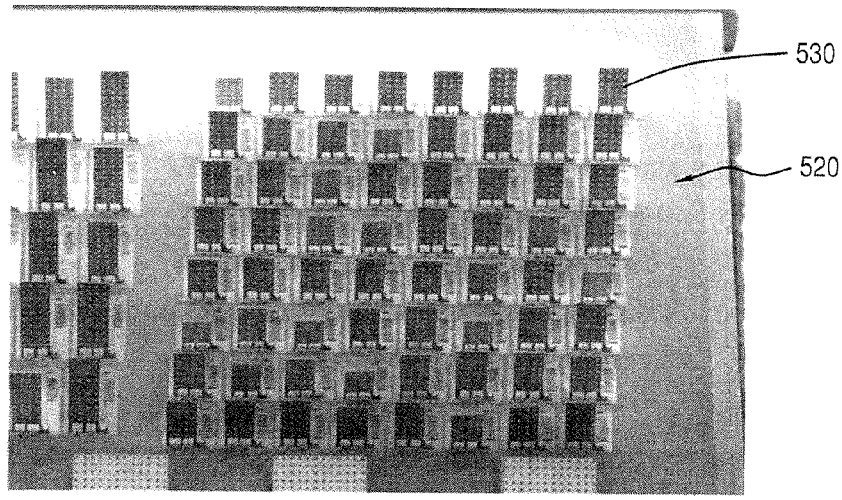
FIG. 6b is a SEM picture of an array of small flaps (180 μm×100 μm) assembled in a similar manner to the embodiment of FIG. 6a, in accordance with the present invention.

Turning now to FIGS. 6a and 6b, a scanning electron microscope (SEM) picture of a vertically-assembled, surface micromachined polysilicon flap 430 configured in accordance with the present invention is shown in FIG. 6a. FIG. 6b shows a system 520 comprising an arrayed version with smaller flaps 530. This embodiment was a prototype for which challenges included getting large angle rotations at smaller operation voltages, with large fill-factors, and these embodiments do not latch the mirrors 520 at one position which is necessary for zero power operation.

The method described here is based on a pixel with a micromirror 520 which can rotate along one or more axes. A number of applications are envisioned for these systems.

Figure 7:
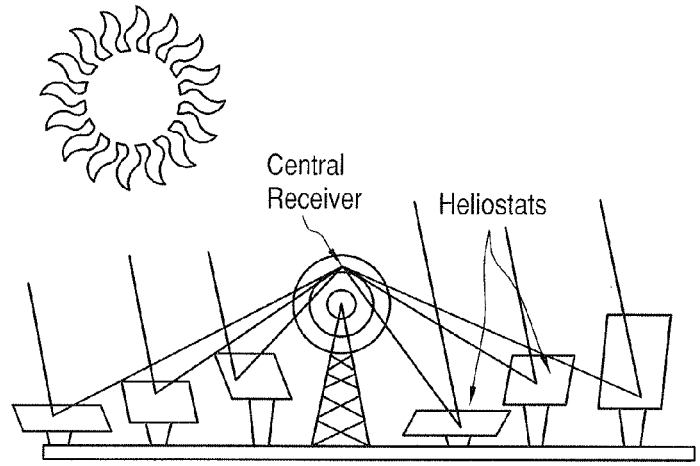
FIG. 7 illustrates a central tower collecting solar power plant situated in an open space; Heliostats are solar tracking large mirror arrays to direct the incoming radiation to the central tower, in accordance with the present invention.
Figure 9:
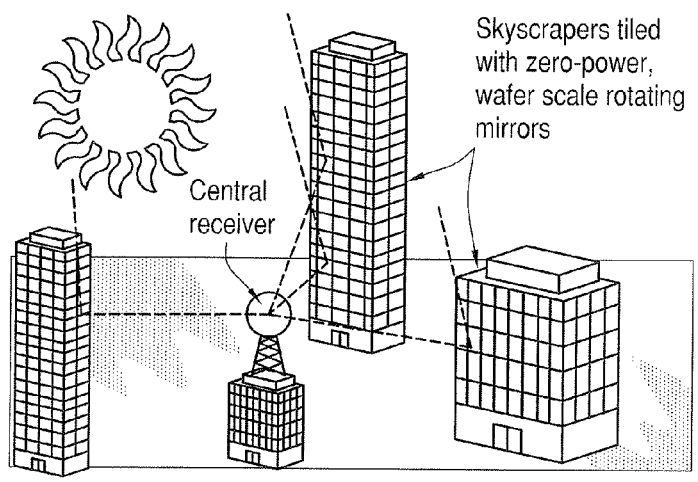
FIG. 9 illustrates buildings such as skyscrapers tiled with concentrating rotating mirror tiles with zero power consumption to track the sun and shine it to a central receiver. The thin form factor of the systems of the present invention enables solar track systems virtually anywhere, and are well suited for use with R2R technologies, in accordance with the present invention.

Concentrated solar track applications (e.g., in Urban Areas) can provide substantial savings by making concentrated solar power plants from unused, non-windowed regions of buildings, as shown in FIGS. 7 and 9. Thin, small form-factor, light weight tiles are easily installed to provide an approach merging the large scale efficiency of solar collector systems with coatable and lightweight attributes of the photovoltaic technology, essentially providing a smart surface coating to any structure.

Current large scale implementations usually employ one of the three methods to concentrate thermal solar energy. 1) Parabolic troughs, 2) parabolic dishes, and 3) central tower systems. Picture of the last concept is illustrated in FIG. 7, where a large array of heliostats tracks the sun for power generation in an open space.

Figure 8:
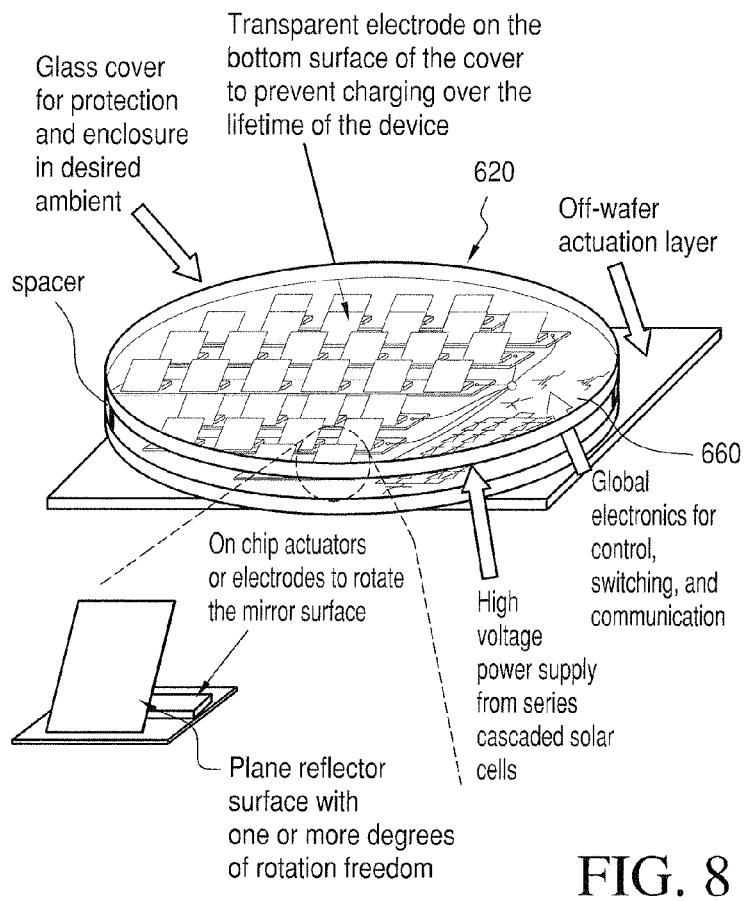
FIG. 8 illustrates components within the system, including (1) a mirror unit pixel with one or more degrees of freedom to rotate/tilt/move, (2) electronics for control, switching or wireless communication, (3) photovoltaic solar cells to generate high voltage to drive the actuators and power the electronics, (4) a transparent cover with transparent conductive coating on the back side for enclosure and charge-free operation (5) an optional layer of actuation outside the enclosure for spatially addressing of the mirrors, in accordance with the present invention.

A typical embodiment of the system of the present invention is illustrated in FIG. 8. The unit element 620 is arrayed with one or more degrees of motion capability to be controlled by an actuator on the same unit cell or by an off-chip actuation layer such as piezoelectric ceramic. An integral global electronics module 660 provides functionality such as control of the actuators, computation, and communication with the outside world. Although FIG. 8 depicts the electronics on the same substrate as the wafer, a optional hybrid approach, where a transmitter and controller is fabricated separately and then attached to the wafer, can be more feasible or cost less. A hybrid approach is the method of choice for organic or flexible, substrates that could be used in roll-to-roll (R2R) manufacturing of the mirror array.

With the described concept of wafer level rotating structures, tiles with almost paper thickness and extremely simple installation can be used to cover all the non-window areas of the buildings in cities, as shown in FIG. 9. This approach does not have a side-effect on the weight of the building; therefore statics of the building is not adversely affected. Furthermore since there are no extruding heliostats, a system with many modular system tiles 620 is not intrusive at all to the esthetics of the building.

The systems of the present invention, with their small form-factor, enable concentrated solar technologies to be installed in places where previously only photovoltaic solutions were useful. Now concentrated solar systems can also be arranged in many non-flat, non-uniform, disjoint patches of locations with the same cost of low installation of non stationary photovoltaic systems. Another application is for power transmission to unmanned small scale aircraft. While information can be transmitted over the air with sufficient efficiency, it is not the case for power. Solar-cell powering of many wireless systems are limited by both the varying sun intensity along the day and the small surface area of the systems. This situation constitutes a convenient framework for the solar-track systems.

Figure 10:
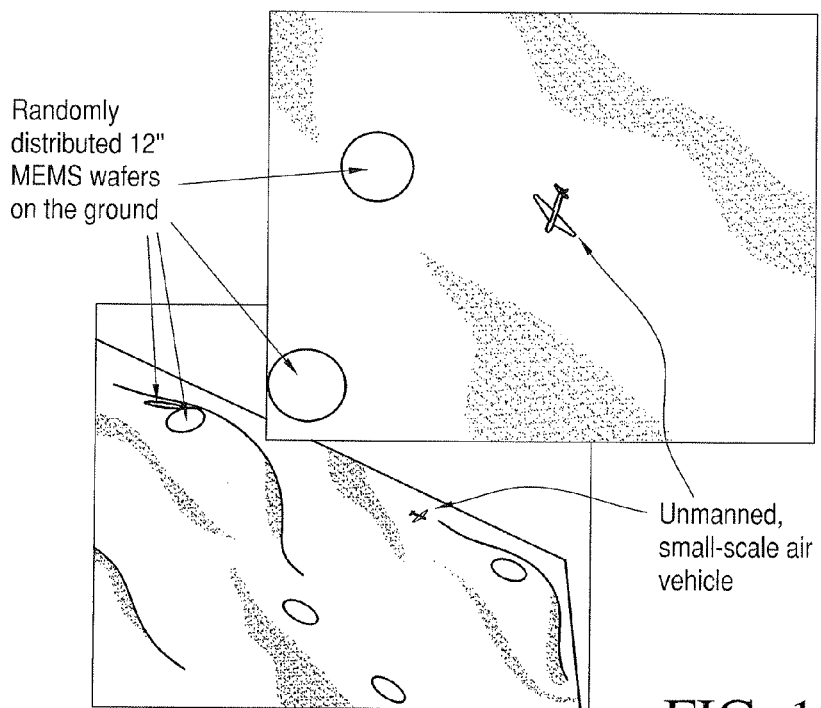
FIG. 10 is a diagram illustrating placement and use of a plurality of beam steering systems for redirecting incident solar energy using a net of randomly distributed 12" wafers on a rough surface to concentrate sunlight onto a moving target in air, where target position is determined by the ground nodes by either GPS or RADAR, in accordance with the present invention.
Figure 11:
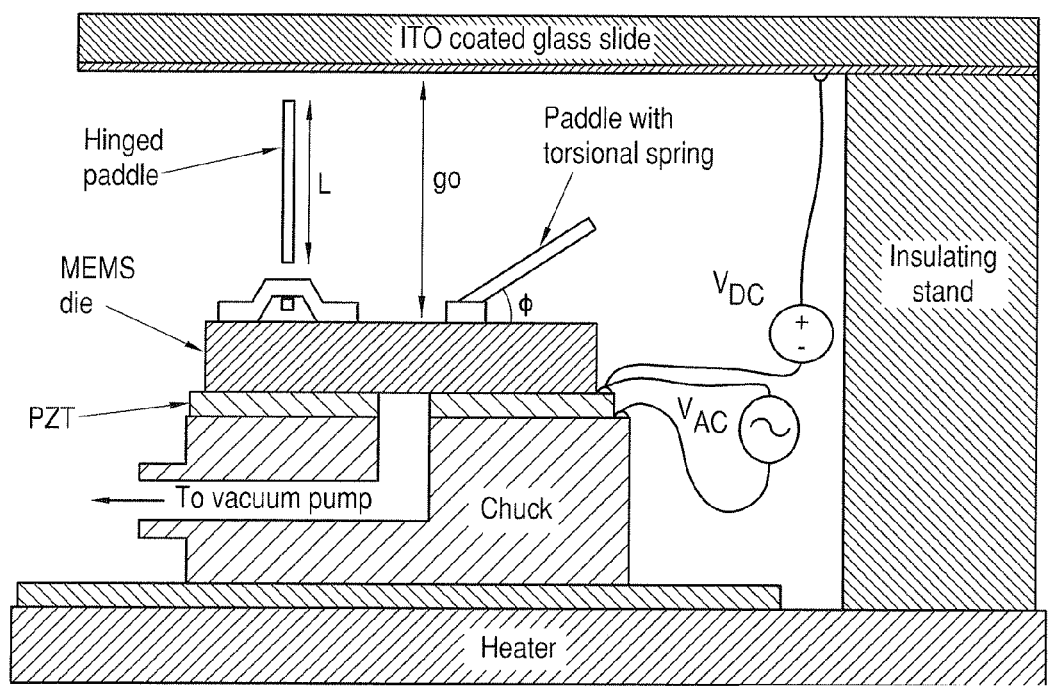
FIG. 11 illustrates an early prototype of the present invention.
Figure 12:
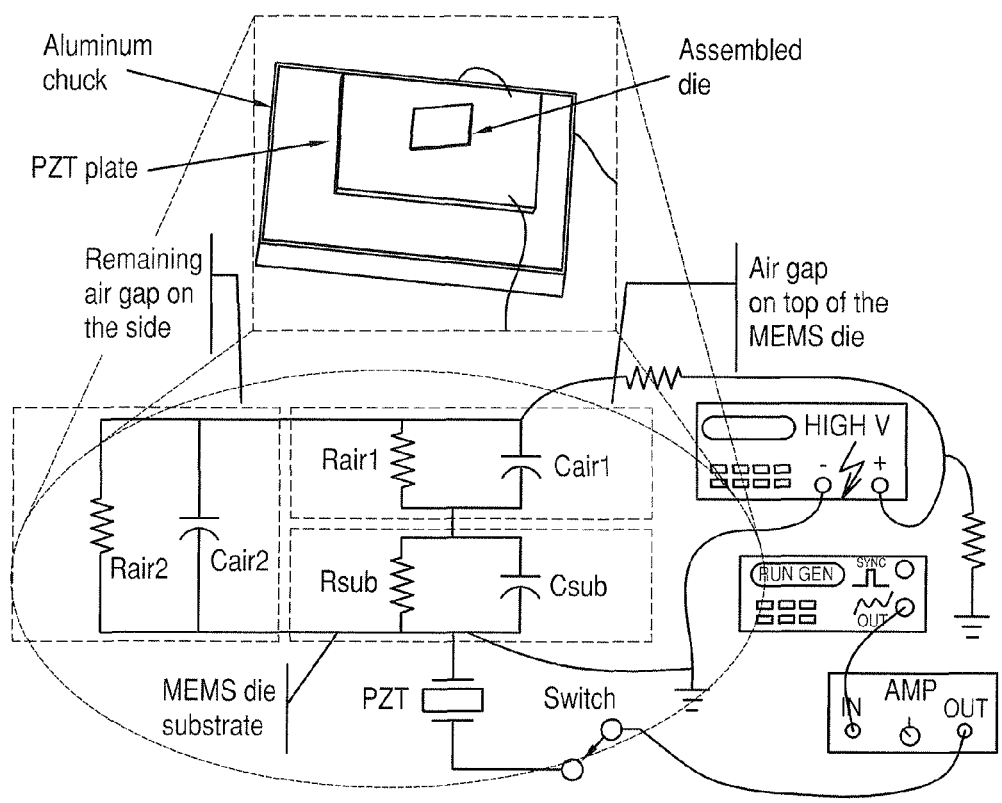
FIG. 12 illustrates an early prototype of the present invention.
Figure 13:
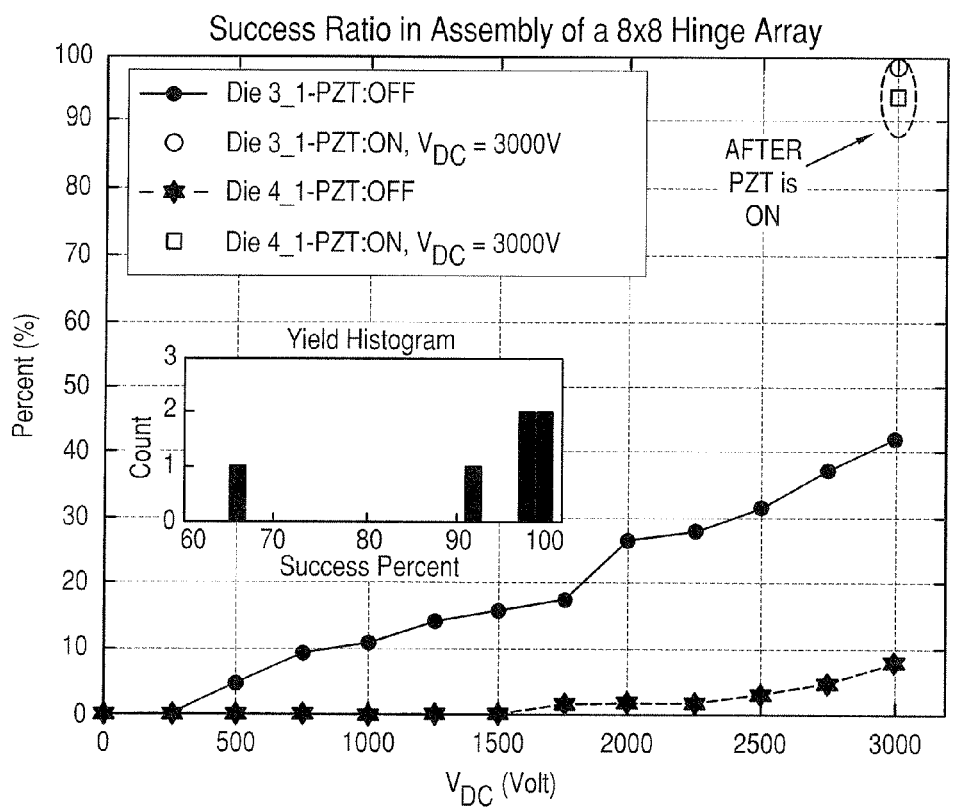
FIG. 13 is a diagram illustrating the success ratio for making an early prototype of the present invention.
Figure 14:
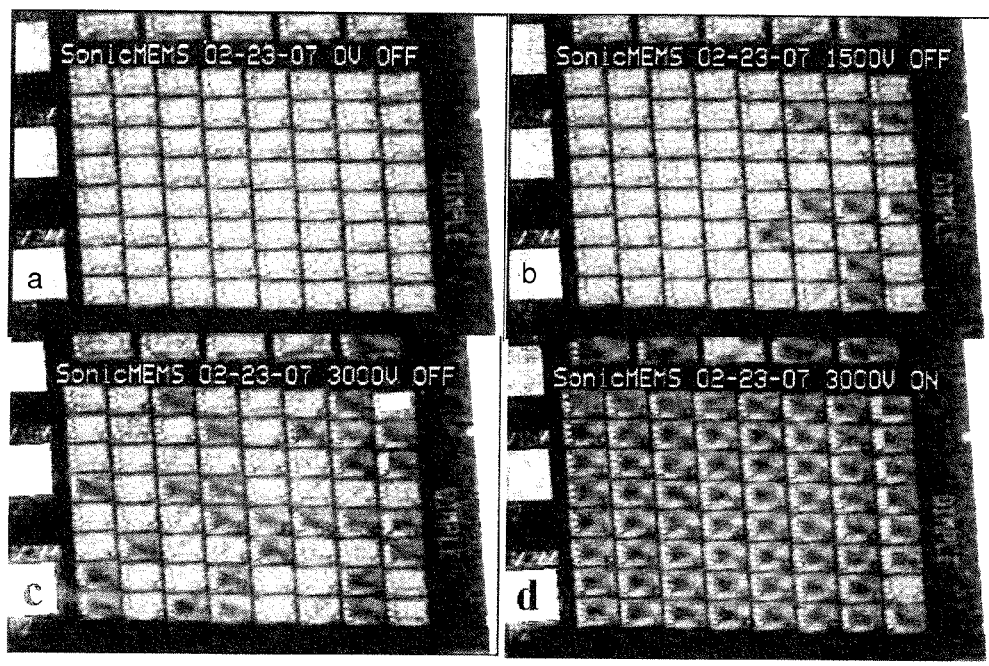
FIGS. 14a-d are photographs illustrating an early prototype of the present invention.
Figure 15:
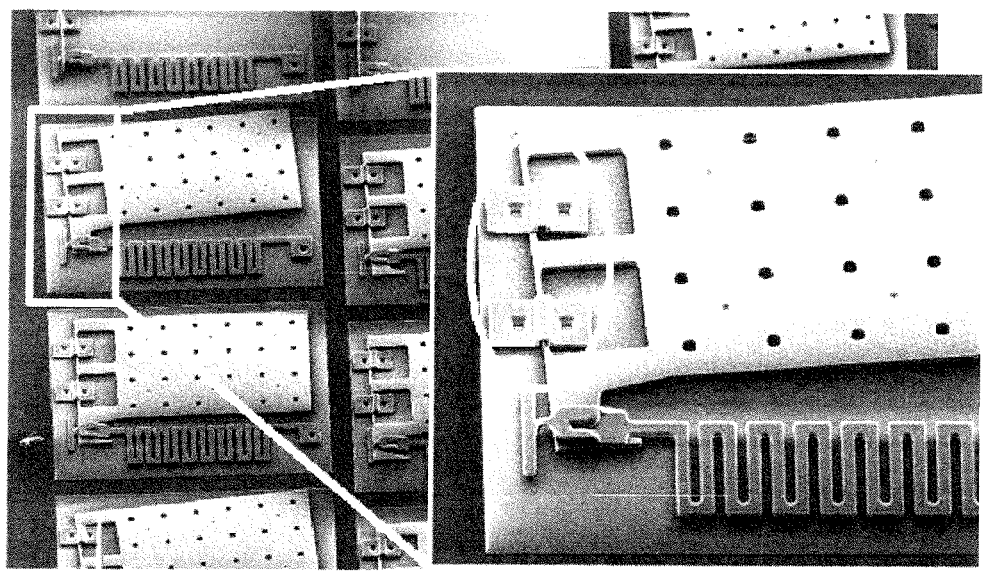
FIG. 15 is a SEM photograph illustrating an early prototype of the present invention.
Figure 16:
FIGS. 16a-c are photographs illustrating an early prototype of the present invention.
Figure 17:
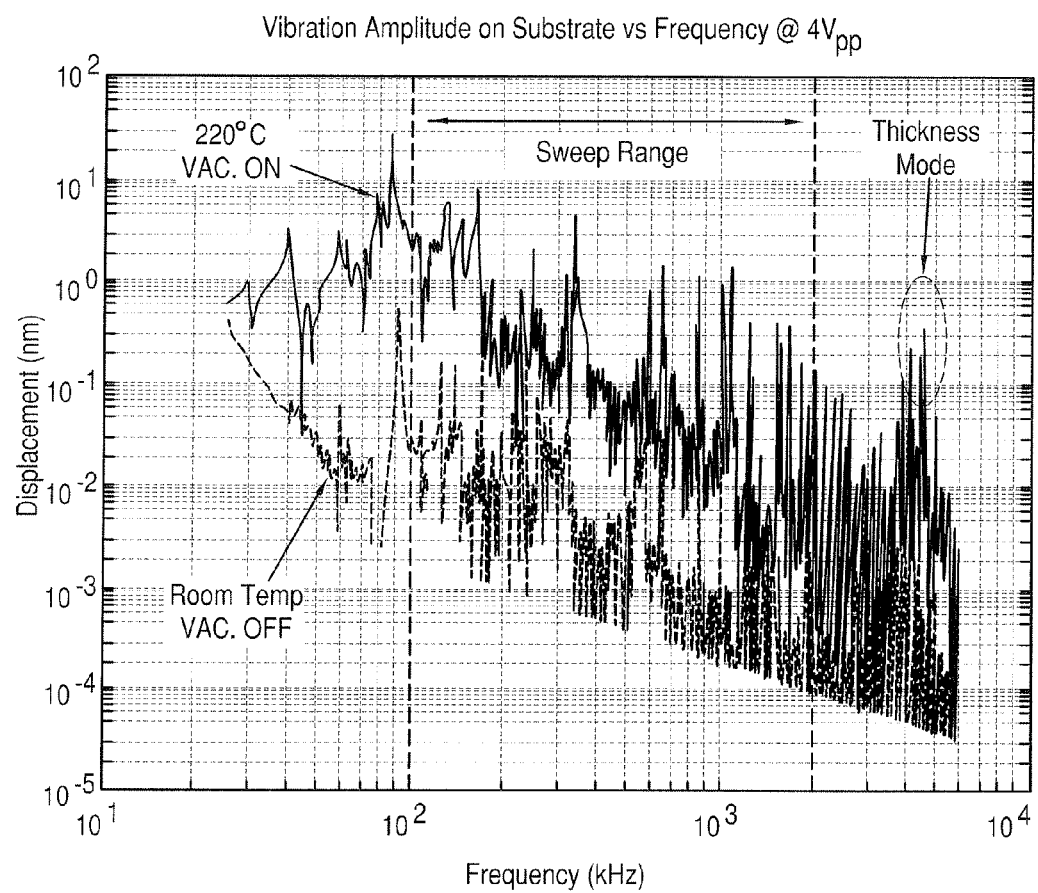
FIG. 17 is a diagram illustrating the displacement amplitude for an early prototype of the present invention.
Figure 18:
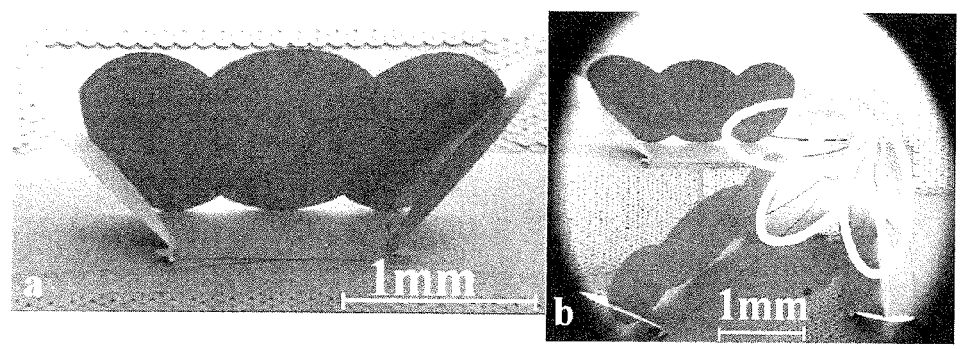
FIGS. 18a-b are photographs illustrating an early prototype of the present invention.

As long as configurable optical surfaces which are aware of the position of the moving target can be realized, they can be controlled so as to concentrate all of the incident solar energy on single surface. This causes a large amplification of the input solar energy to the target. The level of this amplification can simply be changed by adjusting the number of the smart mirror tiles (e.g., 620) tracking the object. A diagram illustrating this application is given in FIG. 10. In addition, concentrated photovoltaic (PV) systems are also popular and rely on the cost advantages of maximizing power incident on unit volume of semiconductor which is more expensive in comparison to rest of the system. Although solar power systems are environmentally friendly, their power production comes at the expense of real estate. Empty territories like deserts or scarcely populated towns are commonly selected for large solar power plants. On the other hand, as the demand for solar energy grows, penetrating the solar technology into households has become an attractive option, given the inefficiencies involved in power storage and transfer.

As noted above, in the method of the present invention, solar power collecting structures (e.g., modular tiles 620, as in FIG. 8) are made and sold to consumers or end users, e.g., through neighborhood hardware stores. The user or consumer buys the modular tiles 620 and places them in a regular array on a roof or in a backyard. The tiles are self-powered to re-direct incident solar light towards a central solar power collector. The tiles 620 consist of a large array of micromirrors that reflect the light towards a specific collection tower, or to a fixed position on the wafer. Tiles adjust themselves so that precise location pinning of the mirrors is not necessary. As the sun moves, or clouds come in certain sunlight view, the mirrors can adjust position to optimize light collection. In addition they can be controlled wirelessly to form desired focusing at a certain GPS coordinate, hence enabling focusing of energy incident on extremely large unflat and disjoint spaces on arbitrary points in the line of sight of mirrors. Large surface area to volume ratio, light weight, and ability to change its rotation and/or orientation allow the tiles to be placed over a flat surface, even by simply dropping them from air.

An early prototype of the system and method of the present invention is illustrated in FIGS. 11-18, in which angular positioning of hinged or compliant reflective paddles or mirrors is accomplished by using off-chip generated ultrasonic and electrostatic forces. The mirror plates are fabricated in mirror arrays. This allows the high lateral fill-factor for the mirrors. For an exemplary embodiment, a selected DC-voltage $V_{DC}$, applied between the chuck holding the die and the global top electrode works to pull the microstructures away from the surface of the die. An ITO coated glass-electrode is used to keep the mirror surfaces optically accessible, so that the motion of the structures can be recorded and analyzed later. A periodic voltage $V_{AC}$, applied across the piezoelectric ceramic (PZT) underneath the die generates stress waves that reach the contacting interfaces at the hinges, stuck parts or sliding surfaces. The stress waves modulate the tribological gap between the surfaces in contact. This modulation acts as an anti-stiction agent as well as a lubricant reducing the friction forces. The reduced friction and stiction enable the external forces such as electrostatic force to rotate the plate. A time varying signal with a selected frequency $V_{AC}$, is linearly swept at the instrument level to excite the time-varying structural resonances during the assembly.

The combination of different actuation mechanisms, namely electrostatic and ultrasonic forces demonstrated by the prototype illustrated in FIGS. 11-18 was further described in the paper authored by the present inventors (Ardanuc S., Lal A., Reyes D., "Process-Independent, Ultrasound-Enhanced, Electrostatic Batch Assembly", Solid-State Sensors, Actuators and Microsystems Conference, 2007. TRANSDUCERS 2007), and the entirety of that paper is included in the US provisional application to which this application claims priority and incorporated herein by this reference.

A second prototype of the micro-reflectors and arrays were configured to be adjustable to a selected angle and then remain where aimed without the need to use additional power until angle was again adjusted. The second prototype is illustrated in FIGS. 19-25. The second prototype system provides semi-permanent angular positioning of hinged or compliant, polysilicon plates 720 by using off-chip generated ultrasonic and electrostatic forces.

Building upon previous results of realizing 90° vertical assembly, this work demonstrated how intermediate angles can be realized by built-in stops for the moving plate 720. By novel lock-in structures and pulsed actuation, the micro-reflectors 720 or mirrors can be trapped and freed from different rotation angles, such that zero static power is needed to maintain a selected angular position. Moreover, lack of on-chip actuators and electrical interconnects on the die enable the realization of very high-fill factors.

The hinged plates 720 are well suited for use in numerous applications such as beam steering and cross connect switches for optical communications. Whether the assembly and actuation operation is carried out once during the lifetime of the device or as a part of the regular operation depends on the application. On-chip actuators, residual stress, and surface-tension forces are some examples of commonly used actuation mechanisms. The prototype described above and illustrated in FIGS. 11-18 demonstrated ultrasound-enhanced electrostatic batch assembly of micro-structures, which involved placing the die in an external DC electric field perpendicular to the substrate and actuating it with an off-chip, bulk-piezoelectric ceramic, and this method yields up to 100 percent success rate in assembling arrays of 8×8 hinged plates perpendicular to the die surface, using permanent lock-in structures.

Lock-in structures or latches are needed for initial assembly of MEMS for applications where the assembled structures are not actuated after the assembly. For applications, where the angular position of the assembled structures need to be controlled as a multi-valued variable, stiction and friction forces combined with periodic array of mechanical bumps and stops presented a solution. In this way, no active power is needed to maintain a specific angular position. For example, concentrating solar power (CSP) is one application for which controlled angular positioning of mirrors would be very useful, as minimal power consumption to maintain mirror position is needed. As in the case of large area LCDs, the technology presented here could be realized on glass to enable inexpensive CSP mirror arrays. The applicant's have developed a lock-in structure that extends the previous work to rotate mirror plates 720 for actuation angles between 0° and 90°. The method of the present invention does not require any on-chip actuators as the actuators are placed under and above the mirror arrays. This allows a high lateral fill-factor for the mirrors and zero-idle power as a result of temporary latching.

Figure 19:
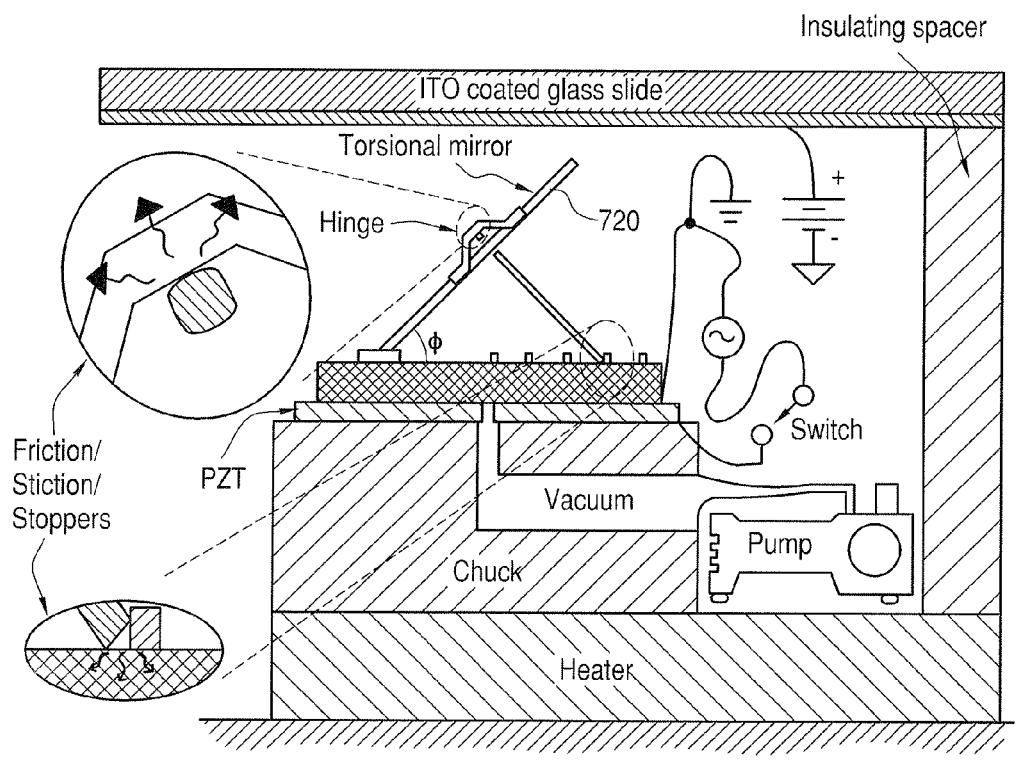
FIG. 19 illustrates a second prototype apparatus for an ultrasound enhanced electrostatic batch assembly, wherein a custom made vacuum chuck allows temporary and residue-free coupling of the ultrasonic vibrations from the PZT plate, in accordance with the present invention.

The second prototype's experimental setup is illustrated in FIG. 19. A DC-voltage $V_{DC}$, applied between the chuck holding the die and the global top electrode works to pull the microstructures away from the surface of the die. An ITO coated glass-electrode is used to keep the mirror surfaces optically accessible, so that the motion of the structures can be recorded and analyzed later. A periodic voltage $V_{AC}$, applied across the piezoelectric ceramic (PZT) underneath the die generates stress waves that reach the contacting interfaces at the hinges, stuck parts or sliding surfaces. The stress waves modulate the tribological gap between the surfaces in contact. This modulation acts as an anti-stiction agent as well as a lubricant reducing the friction forces. The reduced friction and stiction enable the external forces such as electrostatic force to rotate the micro-reflector plate 720. The frequency of $V_{AC}$, is linearly swept at the instrument level to excite the time-varying structural resonances during the assembly process.

The tested devices were fabricated in SANDIA-SwIFT™ process, which is an extension of the 5-layer polysilicon surface-micromachining process, SANDIA-SUMMiT V™, with additional silicon nitride layers. However, the devices illustrated in FIGS. 19-25 were made exclusively of polysilicon layers, so SUMMiT V™ process can also be utilized to obtain the results.

Figure 20:
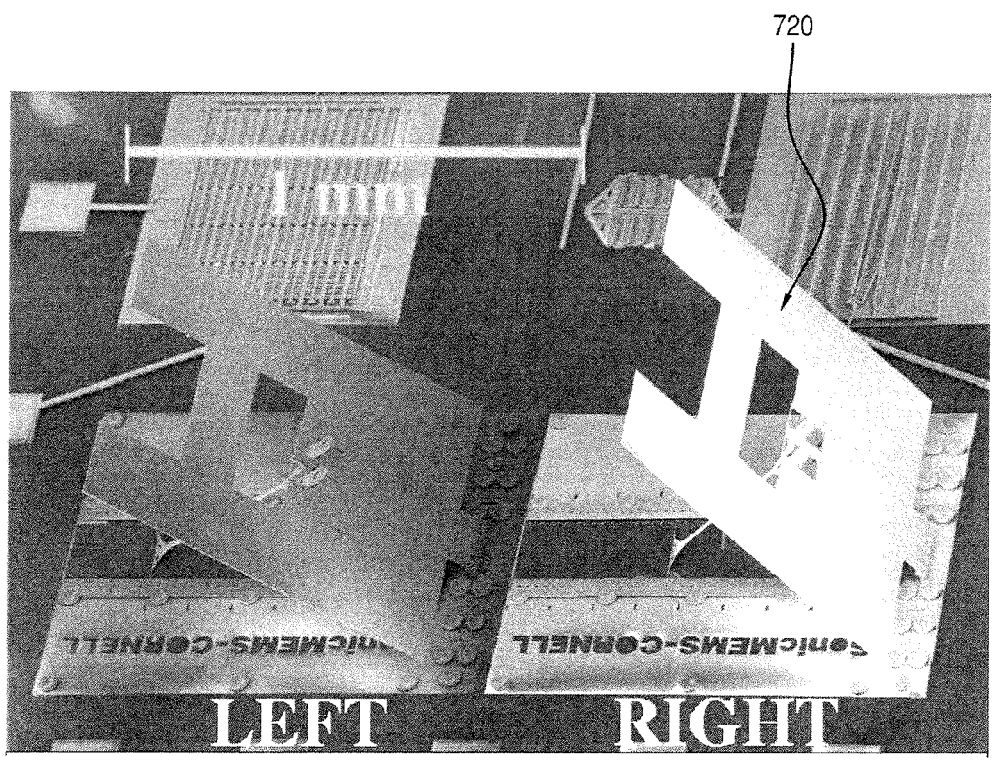
FIG. 20 is an SEM view of an assembled die, the tested dies of the present invention have two identical mirrors.
Figure 21:
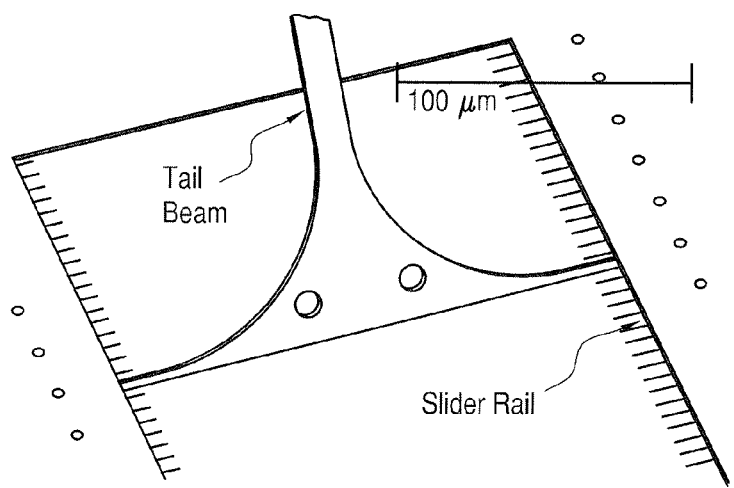
FIG. 21 is a SEM photograph of the tail beam showing that it is constrained to move along the slider rail; the substrate side of the slider-rail is populated with a uniform array of poly-0 notches that serve as stoppers for temporary lock-in/latching.

An SEM picture of a sample die after the assembly experiments is shown in FIG. 20. A pair of identical plates with a footprint of 875 µm×1003 µm is shown. They have a mirror region that can rotate around a torsional rod anchored at two ends. This rod is constrained to rotate in the plane of the substrate with bridge-like clamps that go around the rod. The mirror is connected to a tail-beam 760 by a central moving hinge 750, which is 423 µm away from the rotation axis of the torsional rod. The other end of the tail-beam 760 is in sliding contact with the substrate, and it is forced to move along a line on the substrate, constrained by the slider-rail 770. The slider-rail is populated with a periodic array of bumps 780 at a 6 µm pitch. These bumps act as mechanical stoppers and friction-enhancers as the tail-beam slides along the slider-rail, providing temporary lock-in/latching without any power consumption. Tail-beam 760 and slider-rail 770 are shown in FIG. 21.

Figure 22:
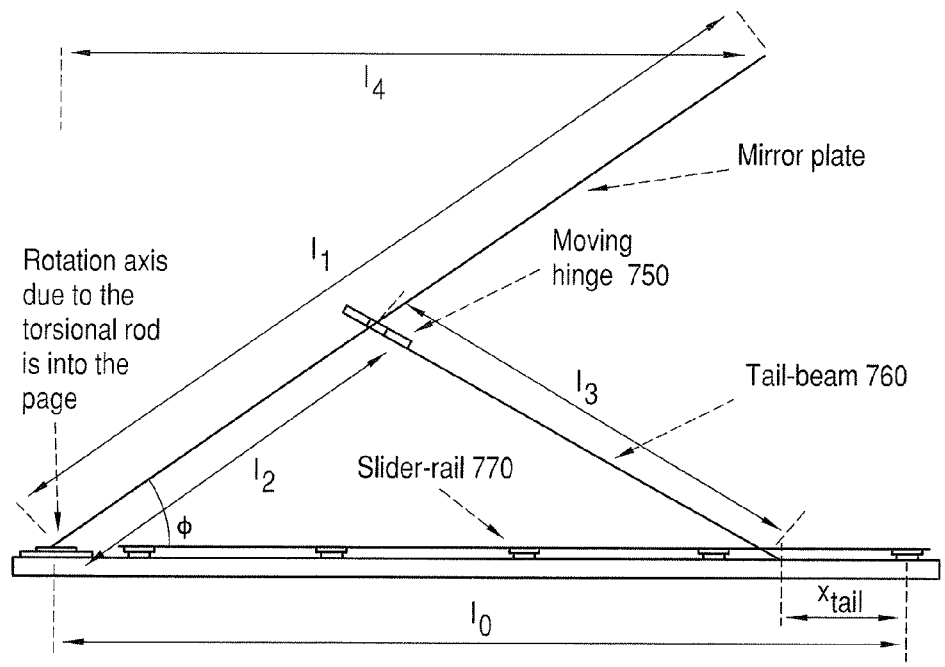
FIG. 22 is a diagram illustrating a cross section of the mirror at an actuated state, showing important geometrical parameters of the design, in accordance with the present invention.

The cross-section of the device and definitions of important geometrical parameters are described in FIG. 22. Mirror rotation angle $\phi$, tail-beam displacement along the slider-rail $x_{tail}$, and the length of the mirror plate projected on a camera positioned on top of the device $l_4$, are extracted during data analysis. $l_0$, $l_1$, $l_2$, and $l_3$ shown in FIG. 22 are fixed by the layout design and their values are $l_0$=914 µm, $l_1$=937 µm, $l_2$=423 µm, $l_3$=503 µm.

Results on Semi-Permanent Latching: The typical actuation parameters pertinent to the experimental setup of FIG. 19 are listed in Table 2. A hot-plate set at 220° C. is used as the heater device to drive water off the die surface for the experiments carried out in an unregulated room ambient. After the wet release, the samples are kept in a nitrogen purged compartment at around 200° C. till the time of the experiment. When the DC-bias is applied between the global top electrode and the chuck in the presence of ultrasound, tail-beam moves over the bumps along the slider-rail allowing the rotation of the mirror. If ultrasound is turned off at this point, the mirror keeps its position even in the absence of DC electric field, thanks to the static friction and stiction forces. This sequence of controlling can be called a SET operation. The micro-reflector or mirror 720 can then be moved in the reverse direction by a RESET operation, which occurs when ultrasound is turned on in the absence of DC-bias such that torsional restoring force and gravity pull the plate down. Likewise, the mirror can be switched between rotated and relaxed positions by successive SET and RESET operations. Measurements of the rotation angle $\phi$, and actuation signals as a function of time t are plotted in FIG. 23 for an experiment, over which a series of SET and RESET operations are applied to the device under test. Data for both the LEFT and RIGHT mirrors on the die are presented.

TABLE 2

Typical experiment parameters.

| Parameter | Value | Unit |
|---|---|---|
| Sweep start frequency | 50 | kHz |
| Sweep stop frequency | 2000 | kHz |
| Sweep time | 3 | sec |
| Sweep type | Linear | — |
| Heater temperature | 220 | °C. |
| Electrostatic Gap | 2.8 ± 0.4 | mm |
| PZT drive amplitude | <20 | $V_{pp}$ |

The data analysis was performed using measurements from a CCD camera facing perpendicular to the die through the top glass electrode. The relations given by the left and right side of Equation 2 describe the two methods that were used to extract the mirror rotation angle φ. The first method requires the measurement of $l_4$ and the second one requires the measurement of $x_{tail}$.

$$\mathrm{acos}\left(\frac{l_4}{l_1}\right) = \phi = \mathrm{acos}\left(\frac{(l_0 - x_{tail})^2 + (l_2)^2 - (l_3)^2}{2l_2(l_0 - x_{tail})}\right) \quad (2)$$

The values of φ calculated from both methods were within 5° of each other. Yet, we report the latter since the rotating tip of the mirror could go out of focus and be blurred in the camera view during the assembly, whereas the sliding tip of the tail beam always stays at the substrate level, regardless of the value of φ.

Figure 23:
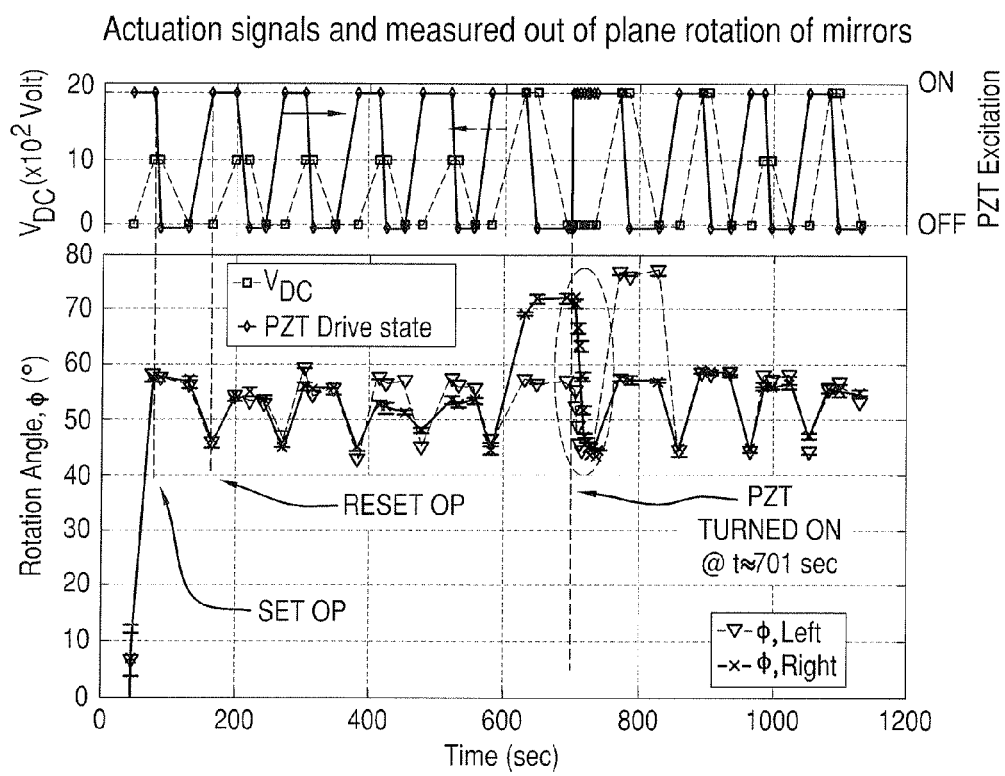
FIG. 23 is pair of plots, where the top plot gives, on the left axis, the applied DC voltage on the global electrode. The right axis plots the state of the manual toggle switch that controls the ultrasonic actuation. The bottom plot gives the optically measured angular position of the mirrors as a function of time during a series of SET and RESET operations which are explained in the text. First SET and RESET operations are indicated in the data set. Stepped operation, which can be observed by zooming in the region highlighted, is shown in FIG. 25.
Figure 24:
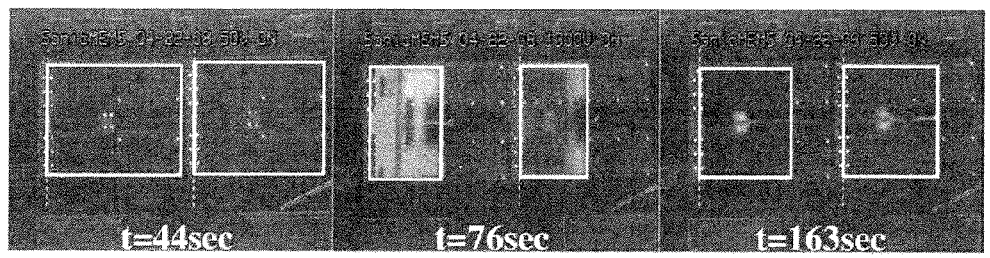
FIG. 24 is a series of three snapshots of the die taken during the experiment, whose results are reported in FIG. 23. The left, center, and right pictures give the initial, after the first SET, and after the first RESET states of the device, respectively. For the sake of clearness, boundaries of the mirrors are framed with white lines.

The two plots on top of FIG. 23 give the state of the PZT excitation (on/off) and the value of the DC voltage applied. DC voltages of up to 2000 V are applied across gaps close to 2.8 mm. The snapshots of the die before the first SET operation (@t=44 sec), after the first SET operation (@t=76 sec), and after the first RESET operation (@t=163 sec) are shown in FIG. 24.

The latching operation is verified from FIG. 23, by noting that following a SET operation, the mirror maintains its angular position after the DC voltage is removed, until PZT is turned on. Although one expects the reset position of the mirror to be close to the horizontal state, that is φ≈0°, it is calculated to be φ≈45° for both of the mirrors. Angular position φ>30° was seen to be the case exclusively after RESET operations on the tested samples. This occurrence can be due to an insufficient clearance at the moving hinge, which connects the tail beam to the mirror plate.

Another peculiarity in FIG. 23 is around t=600 sec, when the DC voltage level applied during the SET operation was raised from 1000 V to 2000 V. The operation predicted at the design level was that the rotation angle would increase due to the increased electrostatic force, hence letting us latch the mirror to an arbitrary angle during the SET operation. On contrary, the increase in the rotation angle at 2000 V as compared to its value at 1000 V was observed only once. Successive SET operations at 2000 V yielded angles close to its value during the SET operation at 1000 V. We also observed pre-breakdown failure at 3000 V. The highest voltage at which SET and RESET operations worked as described above was 2500 V for this particular sample. The breakdown voltage at the experiment conditions is predicted to be 3640±520 V.

The SEM of the assembled device in FIG. 20 and the data of FIG. 23 show differences in the rotation angle response of two identical mirrors on the same die. We connect these differences to the position dependence of the piezoelectric actuation and the stochastic nature of friction and stiction.

Stepped operation for both of the mirrors on the die could be observed during the RESET operation, which occurs in the absence of DC voltage. The supporting data for this observation is given in FIG. 25. It shows a magnified version of the highlighted region around t=700 sec in FIG. 23.

Figure 25:
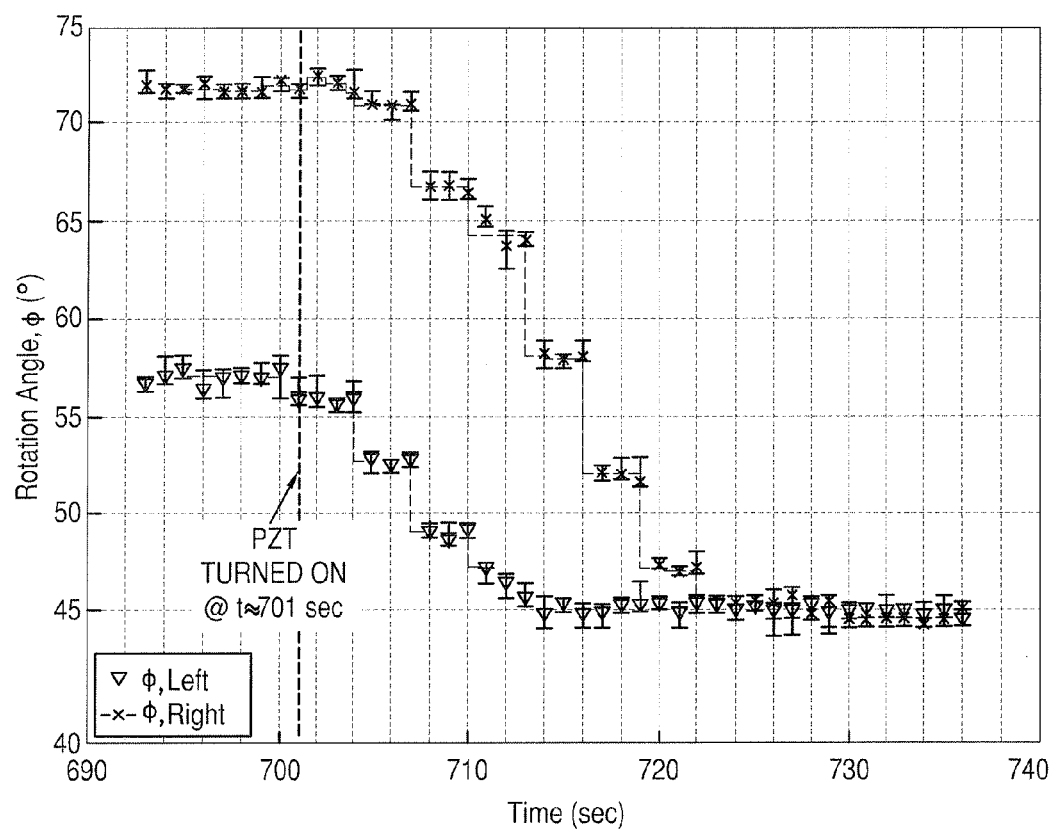
FIG. 25 is a plot illustrating angle as a function of time or angular position of the two mirrors on the die during the reset operation performed around t=701 sec, where stepped operation with a period of about 3 seconds, can be identified, in accordance with the present invention. This duration is equal to the period of the frequency sweep of the PZT drive.

FIG. 25 reveals that one of the mirrors can be made to hold positions at seven different angles between 72° and 45°. The duration of the motion during stepped actuation is about 3 sec, which is equal to the period of the frequency sweep of the ultrasound. As such, certain resonances of the involved structures can be more effective in releasing the semi-permanent latch.

The second prototype's performance demonstrates that ultrasonic-enhanced electrostatic batch assembly can be used for off-chip, angular position control of plane mirrors in a stepped fashion using a mechanism that is reminiscent of a scissor-lift. This mechanism employs a linear-slider populated with an array of mechanical bumps/stoppers, as well as a tail-beam attached to the mirror structure. The duration of the steps of angular displacements was shown to be approximately equal to the period of the frequency-sweep of the ultrasonic actuation. Therefore, angle control at higher precision can, with the structure and method of the present invention, be achieved by tailoring the ultrasonic drive parameters like sweep type and drive amplitude.

Although the invention has been disclosed in terms of a number of preferred embodiment and numerous variations thereon, it will be understood that numerous additional modifications and variations could be made thereto without departing from the scope of the invention as defined in the following claims.

What is claimed is:

1. A system for reflecting or redirecting incident light, microwave or sound energy, comprising:
    (a) a first substrate configured to hingedly support a large tilt angle micromirror array comprising a plurality of reflective elements that are adapted to be angularly displaced through a range of substantially 90 degrees in response to a reflector angle control signal;
    (b) a central or remote controller programmed to generate said reflector angle control signal to achieve a selected incident energy beam or wavefront redirection;
    (c) wherein said reflective elements comprise MEMS minor elements hingedly attached to said first substrate at a proximal edge and defining a reflective surface with a distal edge opposite said proximal edge;
    (d) wherein said MEMS minor elements each carry a central hinge positioned between said proximal edge and said distal edge, said central hinge being configured to hingedly retain a tail member having a hinge end opposite a movable base;
    (e) and wherein said first substrate also includes a slider rail region for each mirror element tail member, said slider region being configured to slidably receive, engage and support said mirror element tail member in one of a selected plurality of tail member positions, such that each mirror element tail member position within said substrate's slider region corresponds with a defined mirror element angular displacement.

2. The system for reflecting or redirecting incident light, microwave or sound energy, of claim 1, wherein said defined mirror angular displacement is substantially zero degrees when said mirror elements are lying substantially flat against said substrate.

3. The system for reflecting or redirecting incident light, microwave or sound energy, of claim 1, wherein said defined mirror angular displacement is substantially ninety degrees when said mirror elements are erected to be substantially perpendicular to said substrate.

4. A system for reflecting or redirecting incident light, microwave or sound energy, comprising:
   (a) a first substrate configured to hingedly support a large tilt angle micro-reflector array comprising a plurality of reflective elements that are adapted to be angularly displaced through a range of substantially 90 degrees in response to a reflector angle control signal;
   (b) a central or remote controller programmed to generate said reflector angle control signal to achieve a selected incident energy beam or wavefront redirection;
   (c) wherein said reflective elements comprise MEMS micro-reflector elements hingedly attached to said first substrate at a proximal edge and defining a reflective surface with a distal edge opposite said proximal edge;
   (d) wherein said MEMS micro-reflector elements each carry a central hinge positioned between said proximal edge and said distal edge, said central hinge being configured to hingedly retain a tail member having a hinge end opposite a movable base;
   (e) and wherein said first substrate also includes a slider rail region for each micro-reflector element tail member, said slider region being configured to slidably receive, engage and support said micro-reflector element tail member in one of a selected plurality of tail member positions, such that each micro-reflector element tail member position within said substrate's slider region corresponds with a defined micro-reflector element angular displacement.

5. The system for reflecting or redirecting incident light, microwave or sound energy, of claim 4, wherein said defined micro-reflector angular displacement is substantially ninety degrees when said micro-reflector elements are erected to be substantially perpendicular to said substrate.

6. The system for reflecting or redirecting incident light, microwave or sound energy, of claim 4, wherein said micro-reflectors are arrayed with very high fill-factor enabled by embedded actuators or actuators that reside off the planar area of the micro-reflectors.

7. The system for reflecting or redirecting incident light, microwave or sound energy, of claim 4, wherein said reflector arrays are positionable for a selected re-directing orientation and then set to remain at that selected orientation without requiring consumption of power so zero power is necessary to keep micro-reflectors at a given angle; wherein power is needed only when position is changed.

8. The system for reflecting or redirecting incident light, microwave or sound energy, of claim 4, wherein said micro-reflectors can be aimed at any angle or azimuth.

* * * * *